United States Patent
Ham et al.

(10) Patent No.: US 9,417,301 B2
(45) Date of Patent: Aug. 16, 2016

(54) RF SHIELD FOR MRI COMPRISING CONDUCTIVE COATING AS SHIELDING MATERIAL

(75) Inventors: Cornelis Leonardus Gerardus Ham, Oirschot (NL); Gerardus Bernardus Jozef Mulder, Best (NL)

(73) Assignee: Koninklijke Philips N.V., Eindhoven (NL)

( * ) Notice: Subject to any disclaimer, the term of this patent is extended or adjusted under 35 U.S.C. 154(b) by 731 days.

(21) Appl. No.: 13/816,512

(22) PCT Filed: Aug. 19, 2011

(86) PCT No.: PCT/IB2011/053658
§ 371 (c)(1),
(2), (4) Date: Apr. 24, 2013

(87) PCT Pub. No.: WO2012/025860
PCT Pub. Date: Mar. 1, 2012

(65) Prior Publication Data
US 2013/0207659 A1 Aug. 15, 2013

(30) Foreign Application Priority Data
Aug. 25, 2010 (EP) .................... 10173946

(51) Int. Cl.
*G01V 3/00* (2006.01)
*G01R 33/422* (2006.01)
(Continued)

(52) U.S. Cl.
CPC ............. *G01R 33/422* (2013.01); *C25D 15/00* (2013.01); *G01R 33/56518* (2013.01)

(58) Field of Classification Search
CPC ........................ G01R 33/42; G01R 33/422

USPC ................................... 324/318, 322
See application file for complete search history.

(56) References Cited

U.S. PATENT DOCUMENTS 5,243,286 A * 9/1993 Rzedzian et al. ............. 324/318
5,304,932 A    4/1994 Carlson
(Continued)

FOREIGN PATENT DOCUMENTS

EP    0430104 A2    6/1991
EP    0896228 A1    2/1999
(Continued)

OTHER PUBLICATIONS

Mager, D., et al.; Operational inkjet-printed metal-on-kapton MRI receiver coil; 2009; Proc. Intl. Soc. Mag. Reson. Med.; 17:505.
(Continued)

*Primary Examiner* — Louis Arana

(57) ABSTRACT

The invention relates to a magnetic resonance imaging system (1) comprising: a main magnet (2) for generating a uniform, steady magnetic field within an examination volume, at least one RF antenna (9) for transmitting RF pulses to the examination volume for magnetic resonance spin excitation, a gradient coil unit comprising gradient coils (4, 5, 6) for generating gradient magnetic fields in the examination volume (100), an RF shield (104) disposed between said RF antenna (9) and said gradient coils (4, 5, 6), said RF shield (104) comprising a shielding material adapted for suppressing Eddy currents induced in the shield by said gradient magnetic fields and for screening RF fields towards the gradient coils (4, 5, 6), said RF fields being generated by the RF antenna (9), wherein the RF shield comprises a conductive coating (104, 110) as shielding material.

18 Claims, 3 Drawing Sheets

(51) Int. Cl.
*C25D 15/00* (2006.01)
*G01R 33/565* (2006.01)

(56) References Cited

U.S. PATENT DOCUMENTS

| | | |
|---|---|---|
| 5,349,297 A | 9/1994 | DeMeester et al. |
| 5,467,017 A | 11/1995 | Duerr et al. |
| 5,844,166 A * | 12/1998 | Halttunen et al. ............ 174/381 |
| 5,886,596 A | 3/1999 | Vaughan, Jr. |
| 6,954,068 B1 | 10/2005 | Takamori et al. |
| 7,230,427 B2 | 6/2007 | Kimmlingen et al. |
| 7,261,950 B2 | 8/2007 | Fleming et al. |
| 7,351,479 B2 | 4/2008 | Funkenbusch et al. |
| 7,489,132 B2 | 2/2009 | Arik et al. |
| 2002/0073717 A1 | 6/2002 | Dean et al. |
| 2004/0033384 A1 | 2/2004 | Funkenbusch et al. |
| 2005/0162166 A1 | 7/2005 | Gebhardt et al. |
| 2006/0001425 A1 | 1/2006 | Weyers et al. |
| 2008/0164876 A1 | 7/2008 | Sakakura et al. |

FOREIGN PATENT DOCUMENTS

| | | |
|---|---|---|
| JP | 63246437 A | 10/1988 |
| JP | 02-095347 A | 4/1990 |
| JP | 03254733 A | 11/1991 |
| JP | 05237071 A | 9/1993 |
| JP | 08322815 A | 12/1996 |
| JP | 1176192 A | 3/1999 |
| WO | 9401785 A1 | 1/1994 |
| WO | 03044552 A2 | 5/2003 |

OTHER PUBLICATIONS

Truhn, D., et al.; Optimized RF shielding techniques for simultaneous PET/MR; 2011; Med. Phys.; 38(7)3995-4000.

* cited by examiner

RF SHIELD FOR MRI COMPRISING CONDUCTIVE COATING AS SHIELDING MATERIAL

FIELD OF THE INVENTION

The invention relates to a magnetic resonance imaging system comprising an RF shield comprising a conductive coating as shielding material, as well as a method of manufacturing a magnetic resonance imaging system.

BACKGROUND OF THE INVENTION

Image-forming MR methods, which utilize the interaction between magnetic field and nuclear spins in order to form two-dimensional or three-dimensional images are widely used nowadays, notably in the field of medical diagnostics, because for the imaging of soft tissue they are superior to other imaging methods in many respects, they do not require ionizing radiation, and they are usually not invasive.

According to the MR method in general, the body of a patient or in general an object to be examined is arranged in a strong, uniform magnetic field B0 whose direction at the same time defines an axis, normally the z-axis, of the coordinate system on which the measurement is based.

The magnetic field produces different energy levels for the individual nuclear spins in dependence on the applied magnetic field strength which spins can be excited (spin resonance) by application of an alternating electromagnetic field (RF field) of defined frequency, the so called Larmor frequency or MR frequency. From a macroscopic point of view the distribution of the individual nuclear spins produces an overall magnetization which can be deflected out of the state of equilibrium by application of an electromagnetic pulse of appropriate frequency (RF pulse) while the magnetic field extends perpendicularly to the z-axis, so that the magnetization performs a precessional motion about the z-axis.

Any variation of the magnetization can be detected by means of receiving RF antennas, which are arranged and oriented within an examination volume of the MR device in such a manner that the variation of the magnetization is measured in the direction perpendicularly to the z-axis.

In order to realize spatial resolution in the body, switching magnetic field gradients extending along the three main axes are superposed on the uniform magnetic field, leading to a linear spatial dependency of the spin resonance frequency. The signal picked up in the receiving antennas then contains components of different frequencies which can be associated with different locations in the body.

The signal data obtained via the receiving antennas corresponds to the spatial frequency domain and is called k-space data. The k-space data usually includes multiple lines acquired with different phase encoding. Each line is digitized by collecting a number of samples. A set of samples of k-space data is converted to an MR image, e.g. by means of Fourier transformation.

One important aspect in magnetic resonance imaging is effective shielding using RF (radio frequency) shields (or RF screens) to screen the above mentioned RF fields towards the gradient coils. There are two major requirements regarding the design of RF-screens: the first requirement is that the RF-screen must be well conducting to act as a shield for the radio frequency fields in the MHz-range generated by the RF antenna of the MR system. However, a favorable highly conducting RF-screen which effectively blocks the RF signals of the RF antenna acts at the same time as a medium in which Eddy currents can be induced due to the switching magnetic field gradients in the kHz-range, wherein these Eddy currents cause substantial heat dissipation in the RF-screen. Thus, the second requirement is that the RF-screen is able to effectively suppress the development of Eddy currents.

However, good RF-screening requires highly conductive materials, whereas highly conductive materials lead to the development of unwanted Eddy currents.

In order to solve this conflict typically slitted RF-screens are used, wherein the slits of the RF-screen are bridged by capacitors to 'close' them for RF. These capacitors can either be discreet components or they may also be distributed capacitors.

For example U.S. Pat. No. 7,230,427 B2 discloses a magnetic resonance apparatus with an RF antenna unit and a gradient coil unit, wherein the MR apparatus comprises an RF shield disposed between the RF antenna unit and the gradient coil unit.

Even though slitting RF-screens and bridging the resulting slits by capacitors yields a good compromise between high conductance for RF shielding and Eddy current suppression, RF-screens manufactured in this manner are expensive due to the slitting and bridging procedure.

From the foregoing it is readily appreciated that there is a need for an improved RF shield. It is consequently an object of the invention to provide an improved magnetic resonance imaging system comprising an improved RF shield.

SUMMARY OF THE INVENTION

In accordance with the invention, a magnetic resonance imaging system is provided, the system comprising a main magnet for generating a uniform, steady magnetic field within an examination volume, and at least one RF antenna for transmitting RF pulses to the examination volume for magnetic resonance spin excitation. Further, the system comprises a gradient coil unit comprising gradient coils for generating gradient magnetic fields in the examination volume. The system further comprises an RF shield disposed between said RF antenna and said gradient coils, said RF shield comprising a shielding material adapted for suppressing Eddy currents induced in the shield by said gradient magnetic fields and for screening RF fields towards the gradient coils, said RF fields being generated by the RF antenna, wherein the RF shield comprises a conductive coating as shielding material.

A magnetic resonance imaging system comprising an RF shield which comprises a conductive coating as shielding material has the advantage, that it can be manufactured in an easy and thus cheap manner. Since no slitting is required anymore in the RF-screen, no bridging by capacitors is necessary which thus eases manufacturing of a respective RF shield and reduces production costs.

The great performance of a conductive coating as shielding material is due to its granular structure with both Ohmic contact between metal grains contained in the coating and capacitive coupling between them. The properties of the conductive coating can thus be varied by changing its composition with regard to the size, shape, electrical properties and the density of the metal grains comprised in the coating. Preferably, the thickness of the conductive coating is in between 7 μm to 25 μm. Further, in a preferred embodiment the sheet resistance of the conductive coating is in between 0.01 and 0.75 Ω/square/25 μm. With such carefully chosen sheet resistances of the conductive coating it is possible to meet both requirements of good RF shielding of the RF fields towards the gradient coil and good Eddy current suppression at the same time.

In accordance with an embodiment of the invention, the conductive coating comprises silver and/or copper as conductive material.

In accordance with a further embodiment of the invention, the parts of the gradient coil unit spatially facing the examination volume are coated with the conductive coating for forming the RF shield. In other words, in this embodiment no extra substrate is required which carries the conductive coating, but the conductive coating is directly applied to the gradient coil unit. This has several advantages: the first advantage is that no extra components are required in the MR system for RF shielding which need to be attached to the MR system as an additional RF shield. The second advantage is that the certain heat generated in the conductive coating due to the development of Eddy currents is directly dissipated towards the gradient coil unit which typically comprises a gradient coil cooling system. Consequently, this gradient coil cooling system can be used to cool at the same time the gradient coils and the RF shield. No extra cooling of the RF shield is necessary which further reduces the production costs of magnetic resonance imaging systems.

A further advantage of this embodiment is that no gap between the RF shield and the gradient coil unit is present, since no extra RF shield is required. This may for instance be used for higher efficiency of an RF coil (for example a body coil) or for a larger patient bore, i.e. a larger examination volume.

In accordance with an embodiment of the invention, the parts of the gradient coil unit comprising the conductive coating are in direct thermal contact with said cooling system. This enables heat dissipation in very high quantities from the RF shield towards the gradient coil cooling system which in turn permits to provide a conductive coating as shielding material with higher conductivity and thus much better RF-screening properties of the RF fields towards the gradient coil. The creation of more Eddy currents and thus more heat dissipation is compensated via the direct thermal contact of the RF shield with the gradient coil cooling system.

In accordance with an alternative embodiment of the invention, the RF shield comprises an electrically insulating substrate, wherein the substrate is coated with the conductive coating. For example, a polycarbonate plate may be used which may be mounted to the gradient coil unit around the RF antenna. This has the advantage that the RF shield can be replaced in an easy and cheap manner. For example, due to wear of the RF shield the conductive coating may be partially removed. Here, the RF shield may be easily repaired by simply replacing the RF shield comprising the substrate carrying the conductive coating with a new RF shield.

In accordance with an embodiment of the invention, the substrate may be directly attached to the gradient coil unit. In an embodiment, the substrate is of an electrically insulating material which at the same time has the property of thermal high conductivity. An example of such a material may for example be aluminium nitride or boron nitride.

Such an electrically insulating but thermally conductive substrate has the advantage that it is able to dissipate heat generated in the conductive coating towards the gradient coil unit. Thus, again the cooling system already comprised with the gradient coil unit may be used for effective heat dissipation in the conductive coating.

Alternatively, it may be possible to provide an air cooling system to the RF shield, wherein the air cooling system is in direct thermal contact with the substrate.

In a preferred embodiment, independent on the substrates thermal conductivity properties, the RF shield may be faced with its coating towards the gradient coil. This permits to increase the distance to the RF coil itself, which is good for RF coil's sensitivity and efficiency. Consequently, the need or high conductance of the coating is decreased. The RF shield of this embodiment may be cooled towards the gradient coil either by air or by a fluid type of material, e.g. a gel, which may be applied after the RF shield has been attached to the gradient coil. However, in general a cooling medium like air or a gel may be applied between the RF shield and the gradient coil unit, independent on the spatial orientation of the coating (towards or away from the gradient coil unit) and independent on the substrates material.

In another aspect, the invention relates to a method of manufacturing a magnetic resonance imaging system as described above, wherein the method comprises providing the conductive coating by spraying techniques or by electroplating. In both cases, respective manufacturing processes can be controlled in an easy and reliable manner thus providing the possibilities of manufacturing magnetic resonance imaging systems.

In case of electroplating, this of course requires an initial special plating deposit on the electrically insulating surface of the substrate to which the conductive coating is to be applied. However, such techniques are well known in the prior art.

BRIEF DESCRIPTION OF THE DRAWINGS

The enclosed drawings disclose preferred embodiments of the invention. It should be understood, however, that the drawings are designed for the purpose of illustration only and not as a definition of the limits of the invention. In the drawings.

DETAILED DESCRIPTION OF THE EMBODIMENTS

Figure 1:
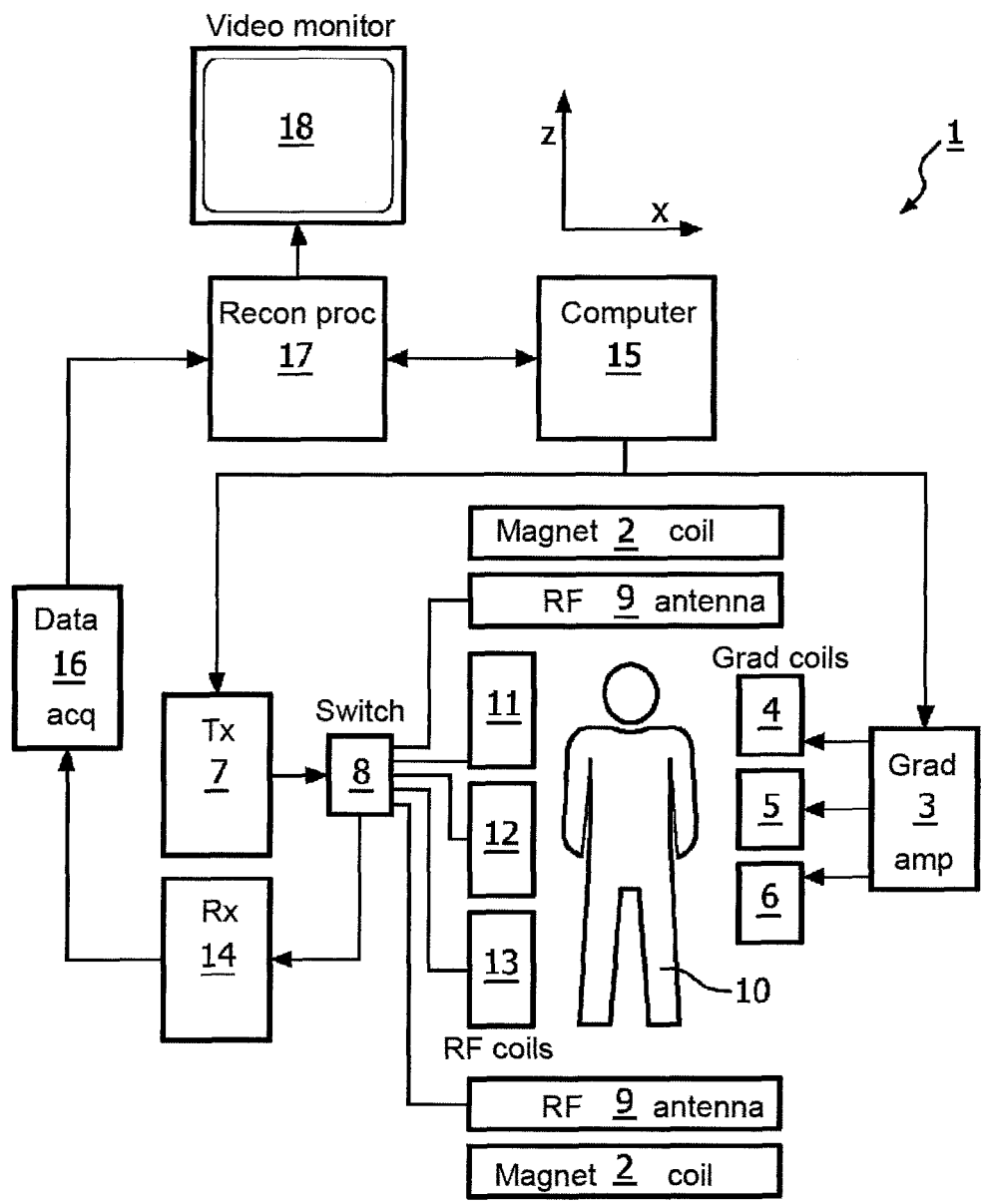
FIG. 1 illustrates a schematic of an MR device according to the invention.

With reference to FIG. 1, an MR imaging system 1 is shown. The system comprises superconducting or resistive main magnet coils 2 such that a substantially uniform, temporarily constant main magnetic field $B_0$ is created along a z-axis through an examination volume.

The magnetic resonance system applies a series of RF pulses and switched magnetic field gradients to invert or excite nuclear magnetic spins, induce magnetic resonance, refocus magnetic resonance, manipulate magnetic resonance, spatially or otherwise encode the magnetic resonance, saturate spins and the like to perform MR imaging.

More specifically, a gradient pulse amplifier 3 applies current pulses to selected ones of whole body gradient coils 4, 5 and 6 along x, y and z-axes of the examination volume. An RF transmitter 7 transmits RF pulses or pulse packets, via a send/receive switch 8 to an RF antenna 9 to transmit RF pulses into the examination volume. A typical MR imaging sequence is composed of a packet of RF pulse sequences of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals may also be picked up by the RF antenna 9.

For generation of MR images of limited regions of the body or in general object 10, for example by means of parallel imaging, a set of local array RF coils 11, 12 and 13 are placed contiguous to the region selected for imaging. The array coils 11, 12 and 13 can be used to receive MR signals induced by RF transmissions effected via the RF antenna. However, it is also possible to use the array coils 11, 12 and 13 to transmit RF signals to the examination volume.

The resultant MR signals are picked up by the RF antenna 9 and/or by the array of RF coils 11, 12 and 13 and are demodulated by a receiver 14 preferably including a pre-amplifier (not shown). The receiver 14 is connected to the RF coils 9, 11, 12 and 13 via a send/receive switch 8.

A host computer 15 controls the gradient pulse amplifier 3 and the transmitter 7 to generate any of a plurality of imaging sequences, such as echo planar imaging (EPI), echo volume imaging, gradient and spin echo imaging, fast spin echo imaging and the like.

For the selected sequence, the receiver 14 receives a single or a plurality of MR data lines in a rapid succession following each RF excitation pulse. A data acquisition system 16 performs analogue to digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies a Fourier transform or other appropriate reconstruction algorithms. The MR image may represent a planar slice through the patient, an array of parallel planar slices, a three-dimensional volume or the like. The image is then stored in an image memory where it may be accessed for converting slices or other portions of the image representation into appropriate formats for visualization, for example via a video monitor 18 which provides a man readable display of the resultant MR image.

Not shown in FIG. 1 is an RF shield disposed between the RF antenna 9 and the gradient coils 4, 5 and 6. This RF shield shall now be described in greater detail with respect to FIGS. 2 and 3.

Figure 2:
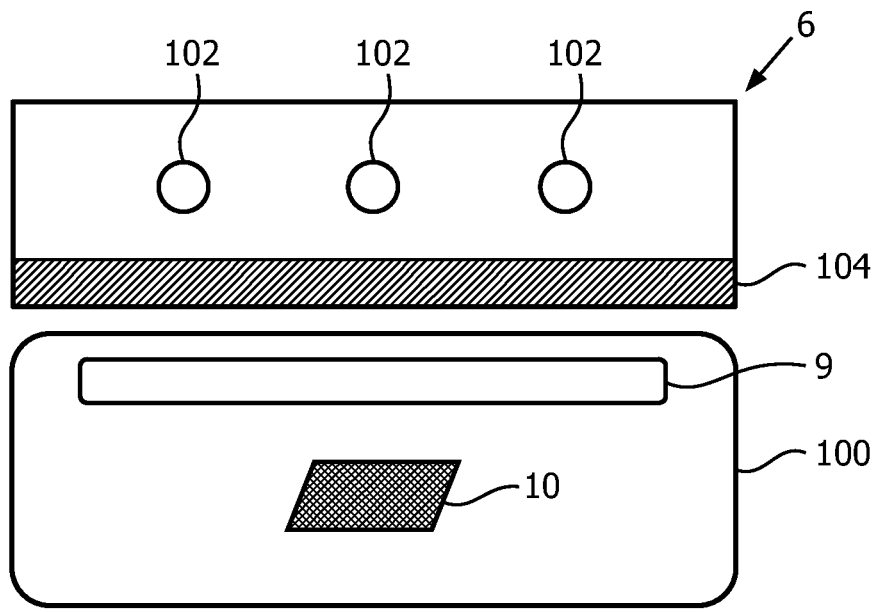
FIG. 2 illustrates a cross-section through an MR system comprising an RF antenna, a gradient coil unit and an RF shield.

FIG. 2 illustrates a schematic of an arrangement of a gradient coil unit comprising a gradient coil 6, for example the z-axis gradient coil of the MR system 1 in FIG. 1, an RF shield 104 and at least one RF antenna 9 for transmitting RF pulses to an examination volume denoted by reference numeral 100. The object to be imaged is denoted by reference numeral 10.

In the embodiment shown in FIG. 2, the gradient coil 6 comprises a cooling system 102, for example a liquid cooling system, wherein in the cross-section shown in FIG. 2 the elements denoted by reference numerals 102 illustrate cross-sections of cooling channels through which a cooling medium may flow.

The RF shield 104 is disposed between the RF antenna 9 and the gradient coil 6, wherein the RF shield comprises a shielding material adapted for suppressing Eddy currents induced in the shields by the switching gradient magnetic fields of the gradient coil 6 and for screening RF fields towards the gradient coil 6, said RF fields being generated by the RF antenna 9. The RF shield 104 is constituted by a conductive coating of the surfaces of the gradient coil 6 facing the examination volume 100. Thus, no spacer between the antenna 9 and the RF-screen 104 is required anymore.

Figure 3:
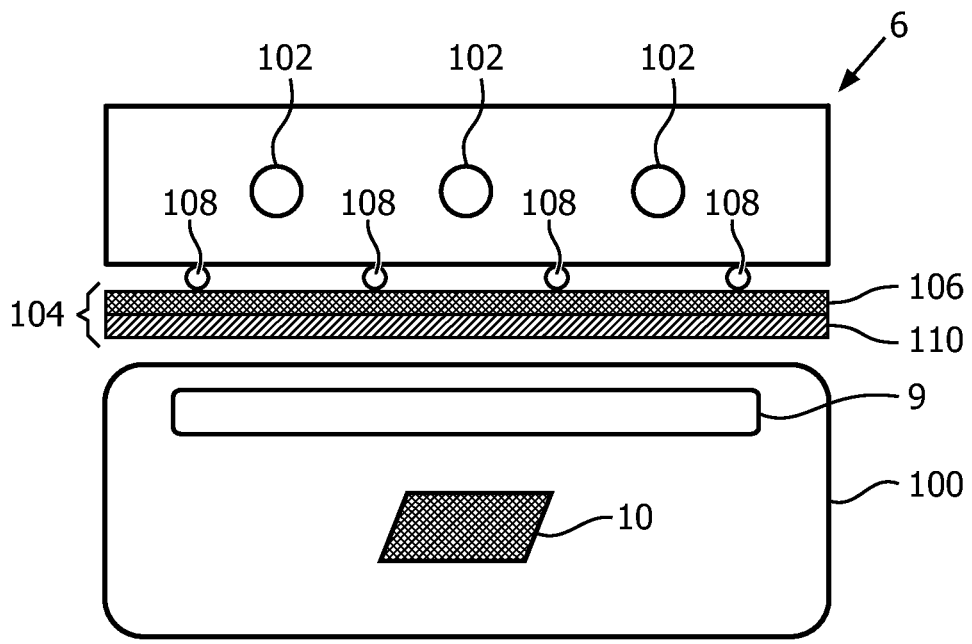
FIG. 3 illustrates a further MR system according to the invention.

In the alternative embodiment of FIG. 3, the RF shield 104 comprises an electrically non-conductive substrate 106 which carries the conductive coating 110 as shielding material. Thus, in the embodiment of FIG. 2 the RF shield is directly constituted by the conductive coating, wherein the conductive coating is directly applied to the gradient coil 6, whereas in contrast in the embodiment of FIG. 3 the RF shield is constituted by the combination of the substrate 106 and the coating 110 which is applied to the substrate 106. However, as mentioned above, in an alternative embodiment, the RF shield may be faced with its coating 110 towards the gradient coil 6.

In order to provide sufficient heat dissipation from the coating 110, in FIG. 3 an additional cooling system 108 may be provided, wherein the elements denoted by reference numeral 108 may for example illustrate cross-sections of tubes through which air may flow for the purpose of heat dissipation. However, as described above, in case the electrically insulating material 106 may possess good thermal conductivity properties, heat dissipation may also be performed from the coating 110 via the substrate 106 towards the cooling system 102 of the gradient coil 6—in this case preferably the substrate 106 is directly applied to the gradient coil 6.

Even though in FIGS. 2 and 3 only a gradient coil 6 was shown, also other parts of a gradient coil unit may be used to carry the conductive coating as shielding material or to carry the substrate to which the conductive coating is applied. Whereas the term 'gradient coil' only denotes the gradient coil by itself, the term 'gradient coil unit' denotes the device which physically carries the individual gradient coils, as well as respective electronic components necessary for controlling and driving the individual gradient coils.

Figure 4:
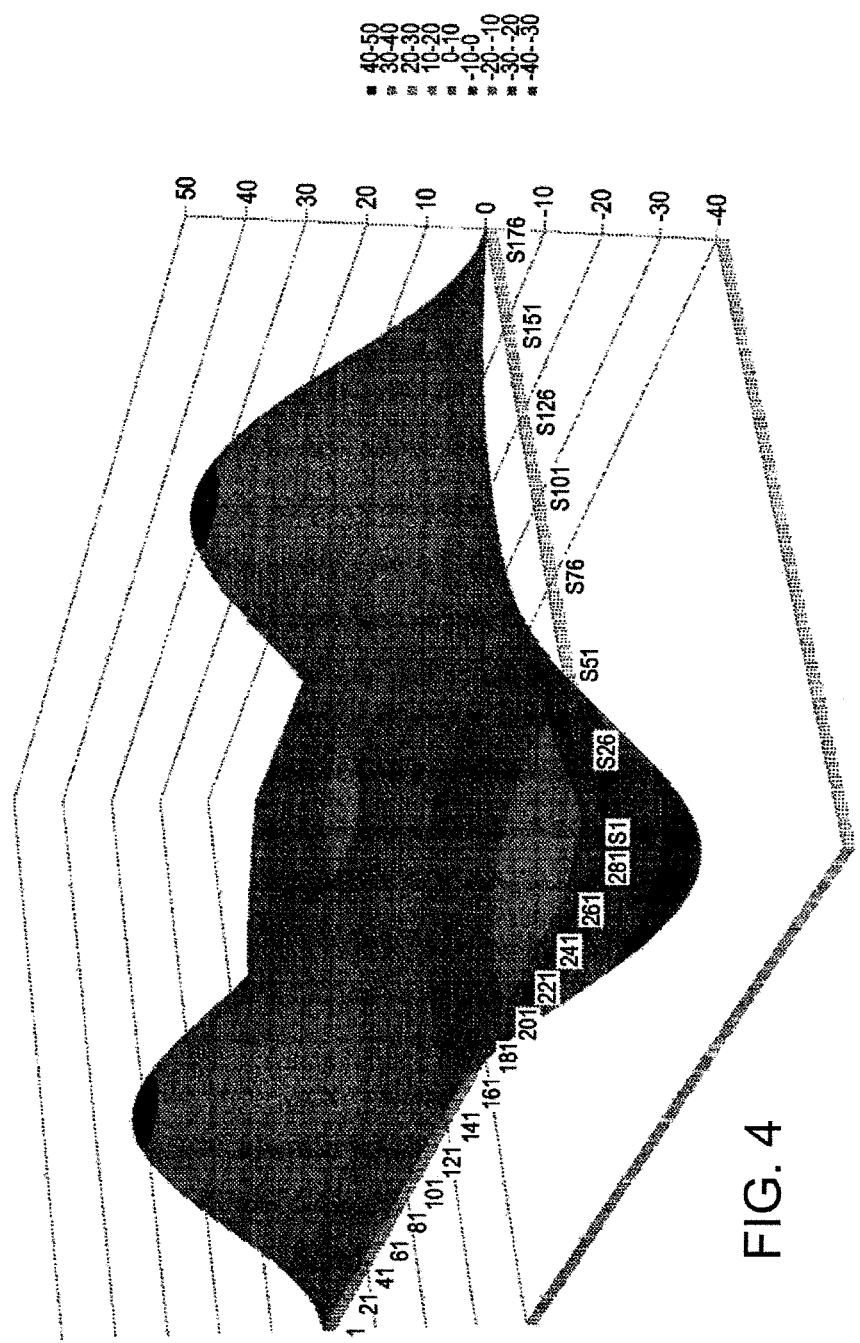
FIG. 4 illustrates a diagram of a simulation of Eddy currents in a conductive coating acting as an RF shield.

FIG. 4 is a simulation diagram of Eddy currents in a conductive coating of an RF shield according to the invention.

The simulation in FIG. 4 was performed for an X-gradient coil. The induced current pattern in the RF-screen resembles the current pattern of the gradient coil itself but with a much lower intensity. Eddy currents in the RF-screen are assumed to originate due to an X-gradient of 100 T/m/s. The current pattern is plotted as stream function in the conductive coating folded out to a flat plate.

An important aspect of the invention is to select the proper thickness and type of coating to ensure that the RF-screen is sufficiently transparent to the gradient fields, switching in the kHz range, and that the RF-screen is sufficiently closed to RF-fields, switching in the MHz range.

Dissipation in a conductive coating of the RF-screen without slitting may be calculated in the following manner: first of all one should consider the resistivity of conductive layer. The resistivity may be specified as sheet resistance expressed in ohm/square/25 um, which is the resistance between two opposite sides of a square surface of 25 um thick. The relation between resistivity and sheet resistance is $$R_{sq} = \frac{\rho a}{da} = \frac{\rho}{d} \text{ so } \rho = R_{sq} d$$

A typical silver coating used in the invention has 0.015 Ω/square/25 μm, or a resistivity of 37.5 μΩcm, which is comparable to stainless steel. The coating thickness is in practice 7 to 25 μm. With the assumption of a layer thickness of 15 μm, it can be shown that the dissipation caused by gradient switching is the dominant heating mechanism. For a gradient coil operating at high slew rate, 100 T/m/s may be averaged over the scan duration. The field component perpendicular to the RF-screen generates Eddy currents that cause dissipation.

It should be noted that a dissipation around 1000 W in the RF-screen is on the high side. However, this is not desirable, even if the heat may be cooled away via the cooling of the gradient coil. The reason is that besides heating, the Eddy currents may generate undesired electromagnetic error fields which affect the quality of the acquired MR images, and draw extra power from the gradient amplifier. In order to obtain a more reasonable dissipation, comparable with current state-of-the-art RF-screens, dissipation around 250 W or lower is desired. The dissipated power scales with d/ρ (d being the layer thickness and ρ denoting the sheet resistance), such that heating can be reduced to an acceptable level by using a conductive layer with lower conductivity (i.e. higher sheet resistance).

For example, as conductive material Ag may be substituted by Cu which also makes the conductive layer less expensive. However, it has to be noted that the conductivity of the conductive layer is less influenced by the choice of the material (i.e. Ag or Cu) than by the concentration, shape and size of the metallic grains in the coating.

Further, a thin layer may be used, preferably in the range of layer thickness in between 7 to 25 μm. Finally, simple slitting may be applied which however is not preferred since this leads to a more complex pattern and requires the use of capacitors for bridging the slits.

Appropriate selection of the conductive material and the layer thickness provides a factor 100 improvement over state of the art RF-screen solutions such that heat dissipation can be reduced to a really insignificant level. This is the principal difference with conventional solutions where the RF-screen is constructed from metal foil. Using metal foil always leads to the regime of high dissipation that requires significant cooling efforts plus the associated earlier mentioned disadvantages. This shows that there is a principal difference between using metal sheets and the a conductive layer.

A magnet quench may also induce currents in the RF-screen, but it's effect is negligible. The mere fact that a gradient system can easily generate 100 T/s continuously at the RF-screen, whereas a magnet quench gives only 2 T/s for a few seconds means that quenches are not a point of concern. Actual calculation of the quench induced heat in the RF-screen according to the invention yields only a small number, e.g. 20 J for a 3T magnet quench and a 15 μm thick Ag-coating RF-screen.

The invention claimed is:

1. A magnetic resonance imaging system comprising:
a main magnet for generating a uniform, steady magnetic field within an examination volume,
at least one RF antenna for transmitting RF pulses to the examination volume for magnetic resonance spin excitation,
a gradient coil unit comprising gradient coils for generating gradient magnetic fields in the examination volume,
an RF shield disposed between said RF antenna and said gradient coils, said RF shield comprising a shielding material adapted for suppressing eddy currents induced in the shield by said gradient magnetic fields and for screening RF fields towards the gradient coils, said RF fields being generated by the RF antenna, wherein the RF shield comprises a conductive coating as shielding material wherein the sheet resistance of the conductive coating is between 0.01 and 0.75 Ω/square/25 μm.

2. The system of claim 1, wherein the thickness of the conductive coating is in between 7 μm to 25 μm.

3. The system of claim 1, wherein the conductive coating comprises at least one of silver and copper as conductive material.

4. The system of claim 1, wherein:
parts of the gradient coil units spatially facing the examination volume are coated with the conductive coating forming the RF shield; and
the gradient coil unit comprises a gradient coil cooling system, wherein the parts of the gradient coil unit comprising the conductive coating are in direct thermal contact with said cooling system.

5. The system of claim 1, wherein the RF shield comprises an electrically insulating substrate, wherein the substrate is coated with the conductive coating.

6. The system of claim 5, wherein the substrate is directly attached to the gradient coil unit.

7. The system of claim 5, further comprising a cooling system comprising a cooling medium for cooling the coating.

8. The system of claim 7, wherein the cooling medium is in direct thermal contact with the substrate.

9. The system of claim 7, wherein the cooling medium is air.

10. The system of claim 7, wherein the cooling medium is a gel.

11. The system of claim 10, wherein the gel is spatially located between the RF shield and the gradient coil unit.

12. The system of claim 5, wherein the conductive coating faces the gradient coil unit.

13. The system of claim 1 wherein the conductive coating has a granular structure comprising metal grains with both ohmic contact between the metal grains and capacitive coupling between the metal grains.

14. The system of claim 1 wherein the conductive coating has no slitting.

15. A magnetic resonance imaging device comprising:
a superconducting or resistive magnet arranged to generate a constant magnetic field in an examination volume;
at least one RF antenna arranged to transmit RF pulses to the examination volume;
gradient coils arranged to generate gradient magnetic fields in the examination volume; and
an RF shield disposed between the RF antenna and the gradient coils, the RF shield comprising a conductive coating having sheet resistance between 0.01 and 0.75 Ω/square/25 μm.

16. The magnetic resonance imaging device of claim 15 wherein the thickness of the conductive coating is in between 7 μm to 25 μm.

17. The magnetic resonance imaging device of claim 15 wherein the conductive coating has a granular structure comprising metal grains with both ohmic contact between the metal grains and capacitive coupling between the metal grains.

18. The magnetic resonance imaging device of claim 15 wherein the conductive coating has no slitting.

* * * * *